United States Patent [19]

Shimotsuma

[11] 4,128,816

[45] Dec. 5, 1978

[54] ELECTRONIC CIRCUIT

[75] Inventor: Nobuo Shimotsuma, Tokyo, Japan

[73] Assignee: Kabushiki Kaisha Daini Seikosha, Japan

[21] Appl. No.: 816,688

[22] Filed: Jul. 18, 1977

[30] Foreign Application Priority Data

Jul. 16, 1976 [JP] Japan .................................. 51/84754

[51] Int. Cl.[2] ............................................... H03B 5/36

[52] U.S. Cl. ................................ 331/116 R; 307/297; 307/304; 331/186

[58] Field of Search ........... 331/108 C, 108 D, 116 R, 331/186, 109, 113 R, 183; 307/297, 304; 58/23 R, 23 AC, 23 A

[56] References Cited

U.S. PATENT DOCUMENTS

| | | | |
|---|---|---|---|
| 3,400,337 | 9/1968 | Sherlin | 331/109 |
| 4,013,979 | 3/1977 | Vittoz | 58/23 A |

*Primary Examiner*—John Kominski
*Attorney, Agent, or Firm*—Robert E. Burns; Emmanuel J. Lobato; Bruce L. Adams

[57] ABSTRACT

An electronic circuit which has a constant voltage circuit comprises a reference voltage generating circuit, a voltage controlled element receiving the signals from said reference voltage generating circuit which is composed of a plurality of MOS transistors, and a load circuit receiving said constant voltage circuit.

8 Claims, 3 Drawing Figures

ELECTRONIC CIRCUIT

BACKGROUND OF THE INVENTION

This invention relates to an electronic timepiece having a constant voltage circuit.

Conventionally, it has been difficult to obtain constant voltage in low-power consumption.

It has been desired to obtain the constant voltage circuit acting in the lower power consumption and this constant voltage circuit has been desired to use in the portable device.

However, as the above constant voltage has not been realized, the mercury cell and silver cell have been used so as to have the constant voltage which is provided to the electronic circuit not operating normally to the voltage variation.

And also, in the case that the portable device has the special circuit making the variation responsive to the variation of the voltage suppress, the stabilization of operating the special circuit has not been maintained.

And further, the electronic circuit for the portable device has the high power dissipation at the average voltage as the electronic circuit is designed to act in the minimum voltage of the power source voltage which is subjected to vary.

The object of this invention is to provide an electronic circuit having a constant voltage circuit and an oscillating circuit serving as a load circuit fabricated on one chip and eliminating the above defects.

And another object of this invention is to provide an electronic timepiece setting automatically the constant power source voltage suitable to drive the C-MOS transistor serving as the load and setting automatically in spite of the process condition of fabricating IC.

Other objects and many of the attendant advantages will be readily appreciated as the subject invention becomes better understood by reference to the following detailed description when considered in conjunction with the accompanying drawings.

DESCRIPTION OF PREFERRED EMBODIMENT

Figure 1:
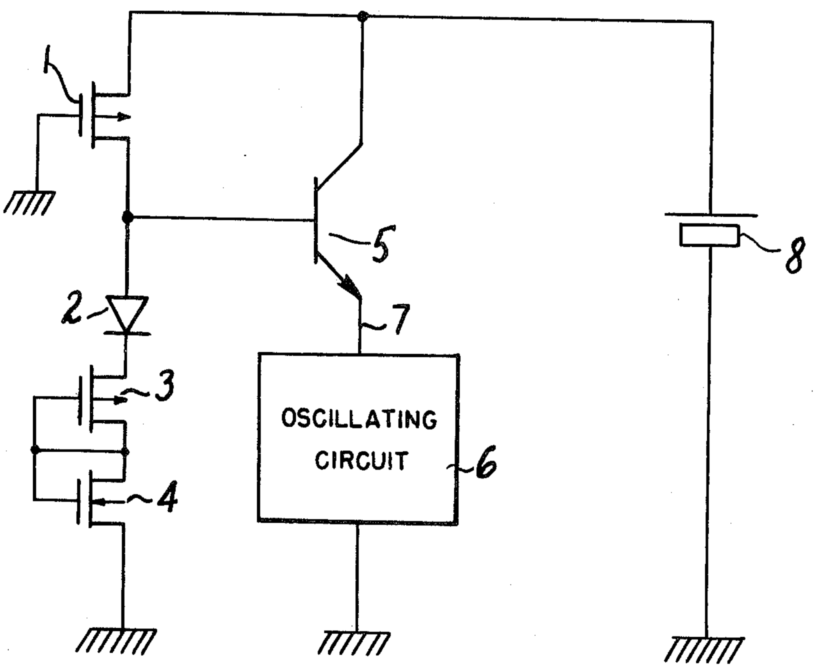
FIG. 1 is a circuit showing an embodiment according to this invention.

Referring now to embodiments of this invention, FIG. 1 is the electronic circuit using the constant voltage circuit.

Reference numeral 1 is P channel MOS transistor serving as the resistor. P channel MOS transistor is made of the diffusion resistance or thin film resistance.

Reference numeral 3 is P channel MOS transistor and reference numeral 4 is N channel transistor.

Reference numeral 8 is power source and reference numeral 5 is bipolar transistor. And this bipolar transistor may be fabricated with the lateral construction.

Reference numeral 6 is electric circuit and reference numeral 7 is the emitter terminal of the transistor 5.

The diode 2 connected in series with the transistor 1 is connected in series with the circuit having the transistors 3 and 4. And the connecting point between the transistor 1 and the diode 2 is connected to the base terminal of the transistor 5.

The collecter terminal of the transistor 5 is connected with the power sourse 8 which is connected with the source terminal of the transistor 1.

And also, the emitter terminal of the transistor 5 is connected with the circuit 6 serving as the load.

Referring next to the operation of the electronic circuit, the voltage of the power source 8 is applied to the tandem circuit which includes the transistor 1 serving as the resistor, the diode 2, and the complementary pair of the transistors 3, 4.

And the drop voltage $V_D$ depending on PN junction of the semiconductor generates across the diode 2, the drop voltage $V_{TP}$ generates across the P channel transistor, and the drop voltage $V_{Tn}$ generates across the N channel transistor.

However, these drop voltages do not depend on the current.

Accordingly, assuming now that little current flows through the transistor for limitting the current, the base terminal of the transistor 5 receives the following voltage $V_B$ in spite of the variation of the power source voltage;

$$V_B \approx V_D + V_{tp} + T_{tm} \cdots\cdots\cdots \quad (1)$$

At the emitter terminal of the transistor, the voltage $V_{BE}$ between the base terminal and the emitter produces.

Accordingly, the voltage of the transistor is provided with the following voltage $V_E$ in spite of the variation of the power source 8.

$$V_E = V_B - V_{BE} \approx V_D + V_{tp} + V_{tn} - V_{BE} \cdots\cdots \quad (2)$$

In the equation (2), assuming that the voltage $V_{BE}$ is almost equivalent to $V_D$, the equation (2) is transformed to the following equation;

$$V_E = (V_D - V_{BE}) + V_{tp} + V_{tn} \approx V_{tp} + V_{tn} \cdots\cdots \quad (3)$$

As mentioned above, the production of the voltage as shown in the equation (3) at the (+) terminal 7 of the constant voltage becomes to provide the most desired voltage $V_E$ to the complementary MOSFET circuit.

The threshold voltages of the P channel and N channel transistors fabricated on one chip do not deviate.

Accordingly, whatever process condition the constant voltage circuit is fabricated, always the voltage $V_E$ as shown in the equation (3) is obtained as the constant voltage.

Figure 2:
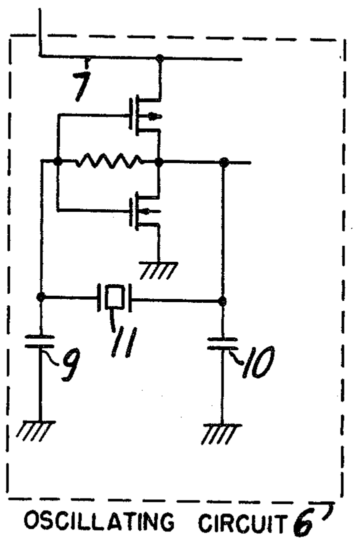
FIG. 2 is an oscillating circuit for timepiece serving as the load circuit of this invention.

FIG. 2 shows the load circuit 6 serving as the oscillating circuit for timepiece.

The oscillating circuit 6 includes C-MOS inverter, the quartz crystal vibrator 11 and the capaciters 9 and 10.

Figure 3:
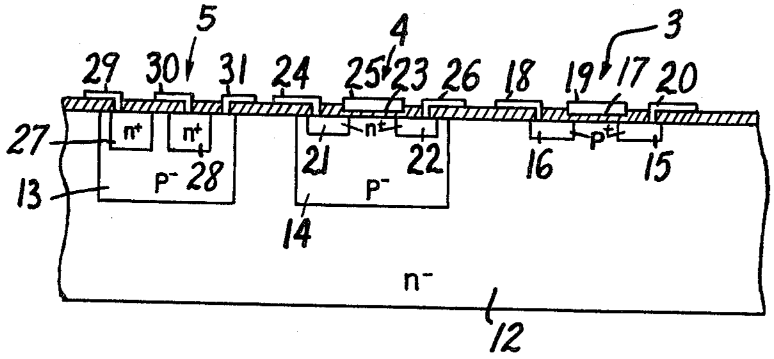
FIG. 3 is a circuit structure of this invention.

FIG. 3 shows the constructure of the electronic circuit as shown in FIG. 1.

The reference numeral 12 is the N type substrate, the reference numerals 13, 14 are $P^-$ well formed on the N type substrate 12, the reference numerals 15, 16 are $P^+$ regions composed of the drain region and source region of P·MOSs, 1 and 3, the reference numeral 17 is the membrane oxide such as $SiO_2$ or the like, the reference numerals 18, 19, 20 are the electrodes formed by Al, Au or the like, and C·MOS included in the load circuit is fabricated.

The reference numerals 21 and 22 are $n^+$ regions formed on the $P^{31}$ well 14 comprising the drain region and source region of N-MOS4. The reference numeral 14 designates the membrane oxide such as $SiO_2$ or the like and the reference numerals 24, 25 and 26 designate electrodes of N-MOS4. Reference numerals 27 and 28 designate the collector region and emitter regions of the bipolar transistor 5 while reference numerals 29, 30 and 31 designate electrodes.

As understood from the constructure as shown in FIG. 3, the bipolar transistor 5 is fabricated when the P·MOSs 1 and 3, N·MOS4 and load circuit is fabricated.

And the respective electrodes thereof are connected each other (as not shown in FIG. 3).

According to this invention, the electronic circuit which is affected by the voltage variation may serve as the load, as the constant voltage circuit in included on one chip.

And also the electronic circuit of this invention is an appropriate circuit which is able to act the complementary MOSFET in little power consumption as it fabriates in any producing process.

And further, the electronic circuit of this invention is able to use the silver peroxide cell having high capacity, low-cost manganese cell, secondary cell using the solar cell having the voltage variation.

As mentioned above, the electronic circuit of this invention is able to attain micro-power with making the constant voltage circuit drive on the optimum condition and also is able to use many kind of power sources.

What is claimed is;

1. An electronic circuit comprising a reference voltage generating circuit, a voltage controlled element, a load circuit and power source, said reference voltage generating circuit comprising a current limiting element connected in series with a reference voltage setting circuit comprising a P channel MOS transistor and an N channel MOS transistor in which a gate of said P channel MOS transistor is connected with a gate of said N channel MOS transistor and with drains of said P channel MOS transistor and said N channel MOS transistor, said voltage controlled element being controlled by an output of a connecting point between said current limiting element and said reference voltage setting circuit, and being connected in series with said load circuit, and said load circuit including a C-MOS inverter and receiving a constant voltage from said voltage controlled element, said power source being connected with said reference voltage generating circuit in parallel with said voltage controlled element connected in series with said load circuit.

2. An electronic circuit according to claim 1, in which the voltage controlled element is a bipolar transistor and the reference voltage setting circuit further includes a diode connected in series between said current limiting element and the source of said P channel MOS transistor.

3. An electronic circuit according to claim 1, in which said current limiting element comprises a P-MOS transistor.

4. An electronic circuit according to claim 3, in which said reference voltage circuit, voltage controlled element and load circuit are on one chip.

5. An electronic timepiece comprising a reference voltage generating circuit, a voltage controlled element, an oscillating circuit including a C-MOS inverter, and a power source, said reference voltage generating circuit comprising a current limiting element connected in series with a reference voltage setting circuit comprising a P channel MOS transistor and an N channel MOS transistor in which a gate of said P channel MOS transistor is connected with a gate of said N channel MOS transistor and with drains of said P channel MOS transistor and said N channel MOS transistor, said voltage controlled element being controlled by an output of a connecting point between said current limiting element and said reference voltage setting circuit, and being connected in series with said oscillating circuit for receiving constant voltage, said power source being connected with said reference voltage generating circuit in parallel with said voltage controlled element connected in series with said oscillating circuit.

6. An electronic timepiece according to claim 5, in which said voltage controlled element is a bipolar transistor and said reference voltage setting circuit further includes a diode connected in series between said current limiting element and the source of said P channel MOS transistor.

7. An electronic timepiece according to claim 5, in which said current limiting element comprises a P-MOS transistor.

8. An electronic timepiece according to claim 7, in which said reference voltage circuit, voltage controlled element and oscillating circuit are on one chip.

* * * * *